US011152269B2

United States Patent
Ikeda et al.

(10) Patent No.: US 11,152,269 B2
(45) Date of Patent: Oct. 19, 2021

(54) PLASMA PROCESSING APPARATUS AND CONTROL METHOD

(71) Applicant: Tokyo Electron Limited, Tokyo (JP)

(72) Inventors: Taro Ikeda, Yamanashi (JP); Yuki Osada, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 176 days.

(21) Appl. No.: 15/947,960

(22) Filed: Apr. 9, 2018

(65) Prior Publication Data

US 2018/0301387 A1    Oct. 18, 2018

(30) Foreign Application Priority Data

Apr. 14, 2017  (JP) .............................. JP2017-080620

(51) Int. Cl.
*H01L 21/66* (2006.01)
*C23C 16/52* (2006.01)
(Continued)

(52) U.S. Cl.
CPC .............. *H01L 22/24* (2013.01); *C23C 14/54* (2013.01); *C23C 16/4558* (2013.01); *C23C 16/45508* (2013.01); *C23C 16/511* (2013.01); *C23C 16/52* (2013.01); *C23C 16/54* (2013.01); *H01J 37/32192* (2013.01); *H01J 37/32935* (2013.01); *H01J 37/32954* (2013.01); *H01L 22/12* (2013.01); *H01J 37/32972* (2013.01)

(58) Field of Classification Search
USPC .............................. 156/345.41; 118/723 MW
See application file for complete search history.

(56) References Cited

U.S. PATENT DOCUMENTS 5,242,561 A * 9/1993 Sato ........................ C23C 14/32
134/1.1
5,961,871 A * 10/1999 Bible ..................... H05B 6/686
219/709

(Continued)

FOREIGN PATENT DOCUMENTS

CN       103258706 A     8/2013
JP    2007-294909 A    11/2007
(Continued)

OTHER PUBLICATIONS

Machine Translation JP2013171847, Fujino et al (Year: 2013).*

*Primary Examiner* — Rakesh K Dhingra
(74) *Attorney, Agent, or Firm* — Abelman, Frayne & Schwab

(57) ABSTRACT

Provided is a plasma processing apparatus including: a plurality of gas supply nozzles which are provided on a wall surface of a processing container and supply process gas toward the inside of the processing container in a radial direction; N microwave introducing modules of which the number disposed in a circumferential direction of a ceiling plate of the processing container so as to introduce microwaves for generating plasma into the processing container, in which N≥2; and M sensors provided on the wall surface of the processing container so as to monitor at least any one of electron density Ne and electron temperature Te of the plasma generated in the processing container, in which M equals to N or a multiple of N.

9 Claims, 10 Drawing Sheets

(51) Int. Cl.
*H01J 37/32* (2006.01)
*C23C 16/54* (2006.01)
*C23C 14/54* (2006.01)
*C23C 16/455* (2006.01)
*C23C 16/511* (2006.01)

(56) References Cited

U.S. PATENT DOCUMENTS

| | | | |
|---|---|---|---|
| 2004/0112292 A1* | 6/2004 | Ishii | H01J 37/32192 |
| | | | 118/723 MW |
| 2005/0009347 A1* | 1/2005 | Matsumoto | G01N 21/68 |
| | | | 438/689 |
| 2005/0034811 A1* | 2/2005 | Mahoney | H01J 37/32935 |
| | | | 156/345.24 |
| 2005/0173069 A1* | 8/2005 | Tolmachev | H01J 37/32192 |
| | | | 156/345.36 |
| 2007/0212254 A1* | 9/2007 | Nagatsu | H01J 37/32568 |
| | | | 422/21 |
| 2009/0120581 A1* | 5/2009 | Qin | G01N 21/73 |
| | | | 156/345.24 |
| 2010/0050938 A1* | 3/2010 | Tetsuka | H01J 37/321 |
| | | | 118/697 |
| 2011/0174776 A1* | 7/2011 | Kabe | H01L 21/02238 |
| | | | 216/59 |
| 2013/0192760 A1* | 8/2013 | Ikeda | H01J 37/32192 |
| | | | 156/345.41 |
| 2016/0276139 A1 | 9/2016 | Osada et al. | |
| 2018/0053634 A1* | 2/2018 | Kraus | C23C 16/511 |
| 2019/0006153 A1* | 1/2019 | Tamari | H01J 37/3222 |

FOREIGN PATENT DOCUMENTS

| | | | |
|---|---|---|---|
| JP | 2009-194032 A | | 8/2009 |
| JP | 2013-077441 A | | 4/2013 |
| JP | 2013-171847 A | | 9/2013 |
| JP | 2013171847 | * | 9/2013 |
| JP | 2016-207915 A | | 12/2016 |
| KR | 10-2013-0095225 A | | 8/2013 |
| KR | 10-2016-0112988 A | | 9/2016 |

* cited by examiner

PLASMA PROCESSING APPARATUS AND CONTROL METHOD

CROSS-REFERENCE TO RELATED APPLICATIONS

This application is based on and claims priority from Japanese Patent Application No. 2017-080620, filed on Apr. 14, 2017, with the Japan Patent Office, the disclosure of which is incorporated herein in its entirety by reference.

TECHNICAL FIELD

The present disclosure relates to a plasma processing apparatus and a control method.

BACKGROUND

As one of the methods of monitoring a state of plasma, there has been known optical emission spectroscopy (OES) (see, e.g., Japanese Patent Laid-Open Publication No. 2016-207915). The optical emission spectroscopy qualitatively analyzes a wavelength of an inherent bright line spectrum (atom spectrum) of an element obtained by vaporizing and exciting an object element in a sample using discharge plasma, and quantitatively analyzes light emission intensity. See, for example, Japanese Patent Laid-Open Publication Nos. 2007-294909, 2009-194032, 2013-077441, and 2013-171847.

SUMMARY

To achieve the aforementioned object, according to one aspect, there is provided a plasma processing apparatus including: a plurality of gas supply nozzles which are provided on a wall surface of a processing container and supply process gas toward an inside of the processing container in a radial direction; microwave introducing modules of which the number is N (N≥2) and which are disposed in a circumferential direction of a ceiling plate of the processing container so as to introduce microwaves for generating plasma into the processing container; and sensors of which the number is N or a multiple of N and which are provided on the wall surface of the processing container so as to monitor at least any one of electron density Ne and electron temperature Te of the plasma generated in the processing container.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
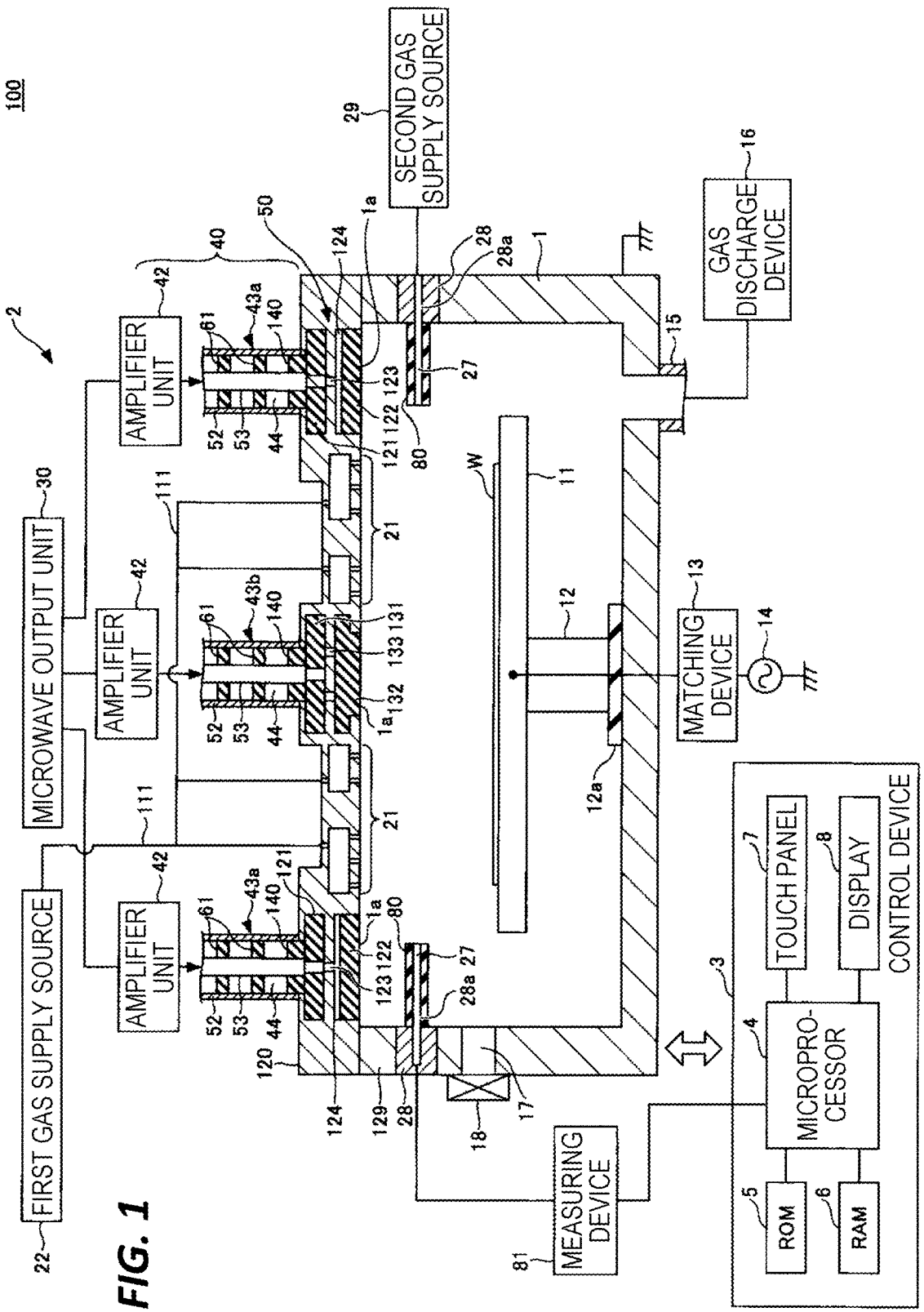
FIG. 1 is a view illustrating an example of a vertical section of a microwave plasma processing apparatus according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the optical emission spectroscopy, it is impossible to monitor the distribution of plasma because the overall state of the plasma is monitored. In addition, in the optical emission spectroscopy, wavelengths of light emission spectrums of different gas excited species overlap one another in some instances in a case in which multiple types of gases are supplied into a processing container, and as a result, accuracy in monitoring plasma characteristics may be insufficient.

Meanwhile, microwaves need to be controlled for each microwave introducing module (hereinafter, the term "microwave introducing module" is used interchangeably with "microwave introducing mechanism") when microwaves are introduced into the processing container from the plurality of microwave introducing modules. For this reason, it is important to ascertain a distribution of plasma.

In regard to the problems described above, in one aspect, an object of the present disclosure is to monitor a distribution of plasma.

To achieve the aforementioned object, according to one aspect of the present disclosure, there is provided a plasma processing apparatus including: a plurality of gas supply nozzles which are provided on a wall surface of a processing container and supply process gas toward the inside of the processing container in a radial direction; N microwave introducing modules of which the number disposed in a circumferential direction of a ceiling plate of the processing container so as to introduce microwaves for generating plasma into the processing container, in which N≥2; and M sensors provided on the wall surface of the processing container so as to monitor at least any one of electron density Ne and electron temperature Te of the plasma generated in the processing container, in which M equals to N or a multiple of N.

In the above-described plasma processing apparatus, the M sensors are provided at a height equal to or lower than a height of the plurality of gas supply nozzles and protrude in a horizontal direction, an oblique direction, or a vertical direction toward the inside of the processing container in the radial direction.

In the above-described plasma processing apparatus, the M sensors are provided at a height higher than a height of the multiple gas supply nozzles, and protrude in a horizontal direction toward the inside of the processing container in the radial direction or are disposed in a state of being embedded in the wall surface of the processing container.

In the above-described plasma processing apparatus, the M sensors are probes that protrude from the wall surface of the processing container toward the inside of the processing container in the radial direction.

In the above-described plasma processing apparatus, the M probes are coated with an insulating material.

In the above-described plasma processing apparatus, the M sensors are disposed at regular intervals in the circumferential direction.

In the above-described plasma processing apparatus, the plurality of gas supply nozzles and the M sensors are provided at the same height.

In the above-described plasma processing apparatus, the M sensors are provided at the same height ranging from −10 mm to 80 mm in a vertical direction from a surface of a placement table on which a workpiece is placed in the processing container.

In the above-described plasma processing apparatus, the plurality of gas supply nozzles and the M sensors provided at different heights.

In the above-described plasma processing apparatus, the M sensors are disposed at positions symmetrical with respect to positions of the N microwave introducing modules disposed at regular intervals on the ceiling plate of the processing container based on a central axis of the processing container.

According to another aspect of the present disclosure, there is provided a method of controlling plasma using a plasma processing apparatus. The plasma processing apparatus includes a plurality of gas supply nozzles which are provided on a wall surface of a processing container and supply process gas toward the inside of the processing container in a radial direction, N microwave introducing modules disposed in a circumferential direction of a ceiling plate of the processing container so as to introduce microwaves for generating plasma into the processing container, in which N≥2, and M sensors provided on the wall surface of the processing container so as to monitor electron density Ne and electron temperature Te of the plasma generated in the processing container, in which M equals to N or a multiple of N. The method includes: controlling at least any one of power of the microwaves introduced from the microwave introducing modules and a phase of the microwaves introduced from the microwave introducing modules based on at least any one of the electron density Ne and the electron temperature Te of the plasma monitored by the sensors.

According to one aspect, it is possible to monitor a distribution of plasma.

Hereinafter, an exemplary embodiment of the present disclosure will be described with reference to the drawings. Further, in the present specification and the drawings, substantially identical configurations are denoted by the same reference numerals, and a repeated description thereof will be omitted.

<Microwave Plasma Processing Apparatus>

FIG. 1 illustrates an example of a cross-sectional view of a microwave plasma processing apparatus 100 according to an exemplary embodiment of the present disclosure. The microwave plasma processing apparatus 100 has a chamber 1 which accommodates a wafer W. The microwave plasma processing apparatus 100 is an example of a plasma processing apparatus for performing a predetermined plasma process on a semiconductor wafer W (hereinafter, referred to as a "wafer W") using surface wave plasma formed by microwaves on a chamber 1 side surface. A deposition process or an etching process is performed as an example of the predetermined plasma process.

The chamber 1 is a substantially cylindrical processing container configured in a gastight manner and made of a metallic material such as aluminum or stainless steel. The chamber 1 is grounded. A microwave plasma source 2 is provided to face the inside of the chamber 1 from openings 1a formed in an inner wall of a ceiling plate of the chamber 1. When the microwaves are introduced into the chamber 1 from the microwave plasma source 2 through the openings 1a, the surface wave plasma is formed in the chamber 1.

A placement table 11 on which the wafer W is placed is provided in the chamber 1. The placement table 11 is supported by a cylindrical support member 12 provided vertically in the center of the bottom portion of the chamber 1 through an insulating member 12a. As an example, a material, which constitutes the placement table 11 and the support member 12, is a metal such as aluminum of which the surface is subjected to an alumite treatment (anodic oxidizing treatment) or an insulating member (ceramics or the like) having therein a high-frequency electrode. The placement table 11 may be provided with an electrostatic chuck for electrostatically holding the wafer W, a temperature control mechanism, and a gas flow path for supplying heat transfer gas to a rear surface of the wafer W.

The placement table 11 is electrically connected to a high-frequency bias power source 14 through a matching device 13. Ions in the plasma are introduced to the wafer W side as high-frequency power is supplied to the placement table 11 from the high-frequency bias power source 14. Further, the high-frequency bias power source 14 may not be provided in accordance with characteristics of the plasma process.

A gas discharge pipe 15 is connected to the bottom portion of the chamber 1, and a gas discharge device 16, which includes a vacuum pump, is connected to the gas discharge pipe 15. When the gas discharge device 16 operates, gas in the chamber 1 is discharged such that pressure in the chamber 1 is decreased at a high speed to a predetermined degree of vacuum. A loading and unloading port 17 for loading and unloading the wafer W and a gate valve 18 for opening and closing the loading and unloading port 17 are provided on the sidewall of the chamber 1.

The microwave plasma source 2 has a microwave output unit 30, microwave transmitting units 40, and microwave radiating members 50. The microwave output unit 30 outputs and distributes the microwaves to a plurality of paths.

The microwave transmitting unit 40 transmits the microwaves output from the microwave output unit 30. Circumferential edge microwave introducing mechanisms 43a and a central microwave introducing mechanism 43b, which are provided in the microwave transmitting units 40, serve to introduce the microwaves output from amplifier units 42 to the microwave radiating members 50 and to match impedance.

The circumferential edge microwave introducing mechanisms 43a and the central microwave introducing mechanism 43b each have a cylindrical outer conductor 52 and a bar-shaped inner conductor 53 provided in the center of the cylindrical outer conductor 52, and the cylindrical outer conductor 52 and the bar-shaped inner conductor 53 are coaxially disposed. A microwave transmitting path 44, through which microwave power is supplied and the microwaves are transmitted toward the microwave radiating member 50, is provided between the outer conductor 52 and the inner conductor 53.

The circumferential edge microwave introducing mechanisms 43a and the central microwave introducing mechanism 43b each have slugs 61, and an impedance adjusting member 140 positioned at a tip end portion thereof. As the slugs 61 are moved, the impedance of a load (plasma) in the chamber 1 are matched with characteristic impedance of microwave power of the microwave output unit 30. The impedance adjusting member 140 is made of a dielectric material such that the impedance of the microwave transmitting path 44 is adjusted in accordance with a relative dielectric constant of the impedance adjusting member 140.

The microwave radiating member 50 is provided to be sealed in a gastight manner in a support ring 129 provided at an upper side of the chamber 1, and radiates microwaves, which are output from the microwave output unit 30 and transmitted from the microwave transmitting unit 40, into the chamber 1. The microwave radiating member 50 constitutes the ceiling portion of the chamber 1.

The microwave radiating member 50 has a main body portion 120, slow-wave members 121 and 131, microwave transmitting members 122 and 132, slots 123 and 133, and dielectric layers 124. The main body portion 120 is made of a metal.

Figure 2:
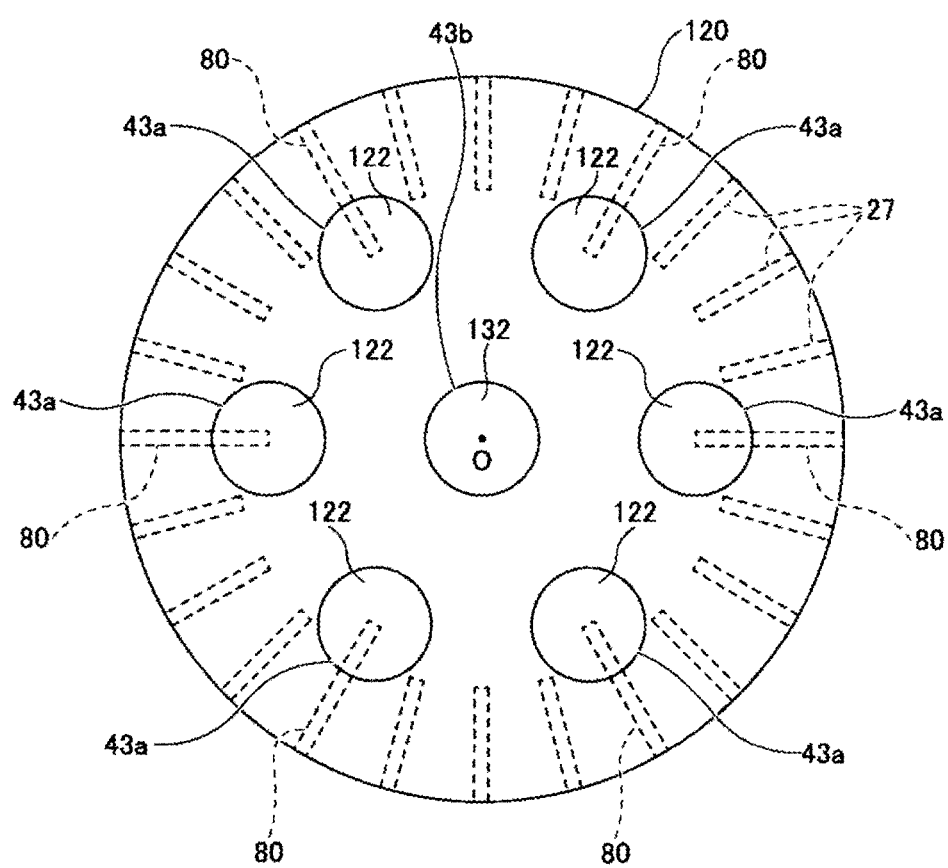
FIG. 2 is a view illustrating an example of an inner wall of a ceiling plate of the microwave plasma processing apparatus according to the exemplary embodiment.

The main body portion 120 has six circumferential edge microwave introducing mechanisms 43a and one central microwave introducing mechanism 43b. As illustrated in FIG. 2, the six circumferential edge microwave introducing mechanisms 43a are disposed in the circumferential direction of the ceiling plate of the chamber 1. The single central microwave introducing mechanism 43b is disposed at a center of the ceiling plate of the chamber 1.

Referring back to FIG. 1, the slow-wave member 121 is fitted into the main body portion 120 so as to correspond to the circumferential edge microwave introducing mechanism 43a, and the wave delay member 131 is fitted into the main body portion 120 so as to correspond to the central microwave introducing mechanism 43b. The slow-wave members 121 and 131 are formed as disk-shaped dielectric members that transmit the microwaves. The slow-wave members 121 and 131 have a relative dielectric constant higher than that of the vacuum, and for example, may be made of ceramics such as quartz or alumina ($Al_2O_3$), a fluorine-based resin such as polytetrafluoroethylene, or a polyimide-based resin. Because the wavelength of microwaves is increased in vacuum, the slow-wave members 121 and 131 are made of a material having a relative dielectric constant higher than that of the vacuum, and as a result, the slow-wave members 121 and 131 serve to decrease a size of an antenna including the slots 123 and 133 by decreasing the wavelength of the microwaves.

Below the slow-wave members 121 and 131, the disk-shaped microwave transmitting members 122 and 132 are fitted into the main body portion 120. The slot 123 and the dielectric layer 124 are formed between the slow-wave member 121 and the microwave transmitting member 122 such that the slow-wave member 121, the slot 123, the dielectric layer 124, and the microwave transmitting member 122 are formed in this order from the upper side thereof. The slot 133 is formed in the main body portion 120 between the slow-wave member 131 and the microwave transmitting member 132.

The microwave transmitting members 122 and 132 are made of a dielectric material that transmits microwaves. FIG. 2 illustrates an example of an inner wall of the ceiling plate of the microwave plasma processing apparatus 100 according to the exemplary embodiment. Gas supply holes are omitted from FIG. 2.

In the present exemplary embodiment, six microwave transmitting members 122, which correspond to six circumferential edge microwave introducing mechanisms 43a, are disposed at regular intervals in the circumferential direction of the main body portion 120, and exposed in a circular shape to the inside of the chamber 1. In addition, the single microwave transmitting member 132, which corresponds to the central microwave introducing mechanism 43b, is exposed in a circular shape toward the inside of the chamber 1 at the center of the chamber 1.

The microwave transmitting members 122 and 132 serve as dielectric windows for forming surface wave plasma uniform in the circumferential direction. For example, similar to the slow-wave members 121 and 131, the microwave transmitting members 122 and 132 may be made of ceramics such as quartz or alumina ($Al_2O_3$), a fluorine-based resin such as polytetrafluoroethylene, or a polyimide-based resin.

In the present exemplary embodiment, the number of circumferential edge microwave introducing mechanisms 43a is six, but the number of circumferential edge microwave introducing mechanisms 43a is not limited thereto, and N circumferential edge microwave introducing mechanisms 43a are disposed. N may be two or more, and may particularly be three or more, and for example, N may be three to six. Further, the microwave radiating members 50 are an example of N (N≥2) microwave introducing modules which are disposed in the circumferential direction of the ceiling plate of the chamber 1 and introduce the microwaves for generating plasma into the processing container.

Referring back to FIG. 1, the microwave radiating members 50 are provided with first gas introducing units 21 having a shower structure, and a first gas supply source 22 is connected to the first gas introducing units 21 through gas supply pipes 111. A first gas, which is supplied from the first gas supply source 22, is supplied in the form of a shower into the chamber 1 through the first gas introducing units 21. The first gas introducing unit 21 is an example of a first gas shower head which supplies the first gas at a first height from a plurality of gas holes formed in the ceiling portion of the chamber 1. Examples of the first gas may include, for example, a gas such as Ar gas for generating plasma, or for example, a gas such as $O_2$ gas or $N_2$ gas to be decomposed by high energy.

Gas supply nozzles 27, which are an example of second gas introducing units, are provided horizontally in the chamber 1 at positions in the chamber 1 between the placement table 11 and the microwave radiating members 50. The gas supply nozzles 27 are connected to gas supply pipes 28a formed in ring-shaped members 28 fitted into the sidewall of the chamber 1, and a second gas supply source 29 is connected to the gas supply pipes 28a. A second gas such as, for example, $SiH_4$ gas or $C_5F_8$ gas, which is a process gas to be supplied without being decomposed to the utmost, is supplied from the second gas supply source 29 during the plasma process such as the deposition process or the etching process. The gas supply nozzles 27 supply the second gas from a plurality of gas holes at a height lower than the height of the plurality of gas holes through which the first gas is supplied from the first gas supply source 22. Further, various types of gases may be used as the gases to be supplied from the first gas supply source 22 and the second gas supply source 29 in accordance with the contents of the plasma process.

Respective parts of the microwave plasma processing apparatus 100 are controlled by a control device 3. The control device 3 has a microprocessor 4, a read only memory (ROM) 5, and a random access memory (RAM) 6. The ROM 5 or the RAM 6 stores a process sequence of the microwave plasma processing apparatus 100 and a process recipe which is a control parameter. The microprocessor 4 is an example of a controller which controls the respective parts of the microwave plasma processing apparatus 100 based on the process sequence and the process recipe. In addition, the control device 3 has a touch panel 7 and a display 8, and may display an input or a result when performing predetermined control according to the process sequence and the process recipe.

When the microwave plasma processing apparatus 100 having such a configuration performs the plasma process, a wafer W is first loaded into the chamber 1 through the loading and unloading port 17 from the opened gate valve 18 in a state in which the wafer W is held on a transfer arm. The gate valve 18 is closed after the wafer W is loaded. When the wafer W is transferred to a position above the placement table 11, the wafer W is transferred from the transfer arm to pusher pins and placed on the placement table 11 as the pusher pins move downward. The pressure in the chamber 1 is maintained to a predetermined degree of vacuum by the gas discharge device 16. The first gas is introduced in the form of a shower into the chamber 1 from the first gas introducing units 21, and the second gas is introduced in the form of a shower into the chamber 1 from the gas supply nozzle 27. The first gas and the second gas are decomposed by the microwaves radiated from the microwave radiating members 50 through the circumferential edge microwave introducing mechanisms 43a and the central microwave introducing mechanism 43b such that the plasma process is performed on the wafer W by the surface wave plasma generated on the surface at the side of the chamber 1.

<Microwave Plasma Source>

Figure 3:
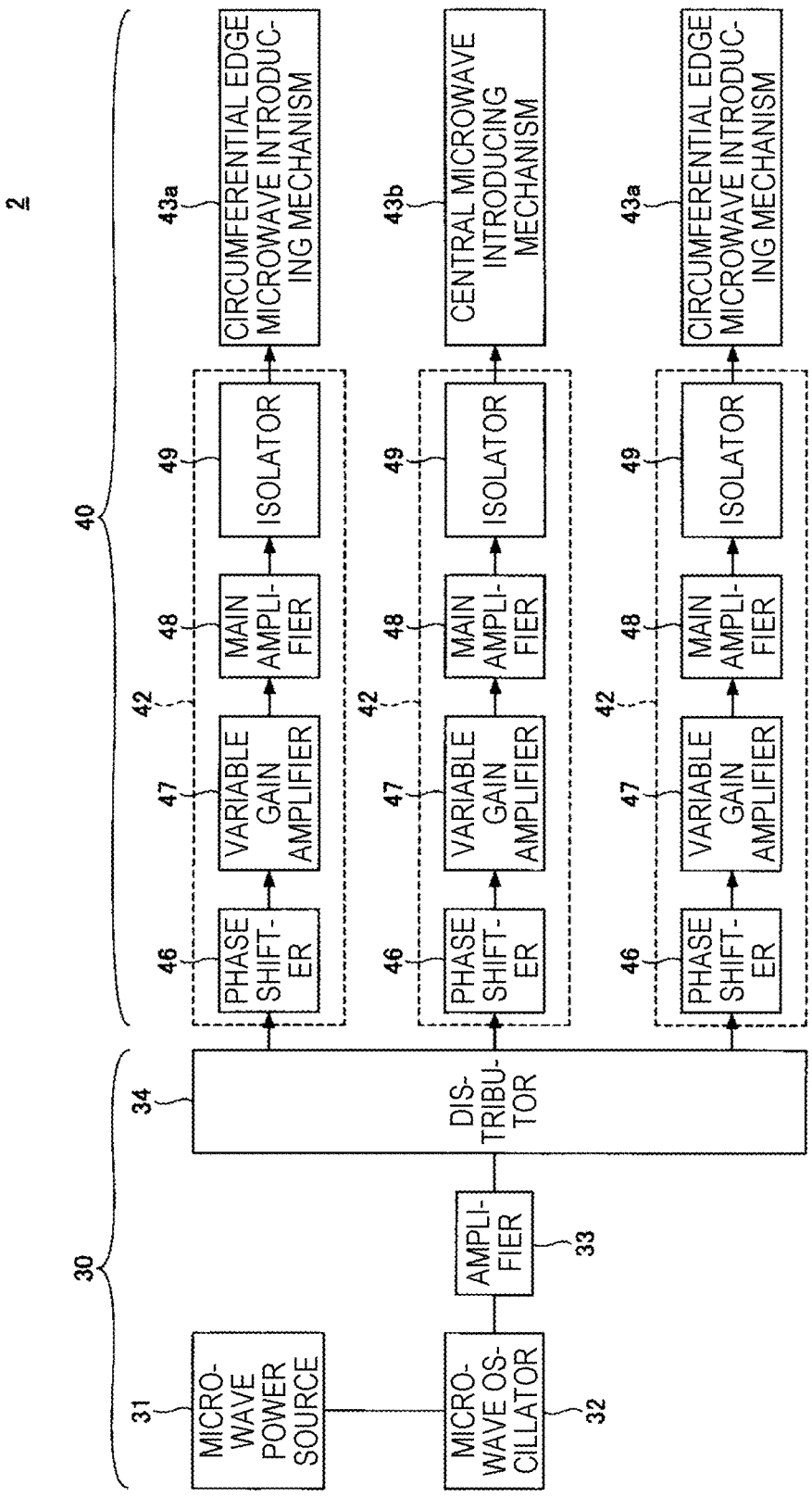
FIG. 3 is a view illustrating an example of a configuration of a microwave plasma source according to the exemplary embodiment.

As illustrated in FIG. 3, the microwave output unit 30 of the microwave plasma source 2 has a microwave power source 31, a microwave oscillator 32, an amplifier 33 which amplifies a generated microwave, and a distributor 34 which distributes the amplified microwave to a plurality of microwaves.

The microwave oscillator 32 generates microwaves having a predetermined frequency through, for example, a phase locked loop (PLL). The distributor 34 distributes the microwaves amplified by the amplifier 33 while matching the input side impedance and the output side impedance so as to inhibit a loss of microwaves to the utmost. Further, various types of frequencies ranging from 700 MHz to 3 GHz may be used as the frequency of the microwaves.

The microwave transmitting unit 40 has the plurality of amplifier units 42, and the circumferential edge microwave introducing mechanisms 43a and the central microwave introducing mechanism 43b which are provided to correspond to the amplifier units 42. The amplifier units 42 guide the microwaves, which are distributed by the distributor 34, to the circumferential edge microwave introducing mechanisms 43a and the central microwave introducing mechanism 43b. The amplifier unit 42 has a phase shifter 46, a variable gain amplifier 47, a main amplifier 48 which constitutes a solid state amplifier, and an isolator 49.

The phase shifter 46 may modulate radiation characteristics by changing the phases of the microwaves. For example, it is possible to change a plasma distribution by controlling directivity by adjusting the phases of the microwaves introduced to the circumferential edge microwave introducing mechanisms 43a and the central microwave introducing mechanism 43b. In addition, it is possible to obtain circularly polarized waves by shifting the phases of the adjacent microwave introducing mechanisms by 90°. In addition, the phase shifter 46 may be used for the purpose of space synthesis in a tuner by adjusting delay characteristics between components in the amplifier. However, the phase shifter 46 may not be provided when it is not necessary to adjust the radiation characteristics or to adjust delay characteristics between the components in the amplifier need to be modulated.

The variable gain amplifier 47 adjusts plasma intensity by adjusting a power level of the microwave input to the main amplifier 48. The variable gain amplifier 47 is changed for each antenna module such that a distribution of the generated plasma occurs.

For example, the main amplifier 48, which constitutes a solid state amplifier, has an input matching circuit, a semiconductor amplifier element, an output matching circuit, and a high-Q resonance circuit. The isolator 49 is configured to separate reflective microwaves which are reflected by a slot antenna unit and directed toward the main amplifier 48, and the isolator 49 has a circulator and a dummy load (coaxial terminator). The circulator guides the reflected microwaves to the dummy load, and the dummy load converts the reflective microwaves, which is guided by the circulator, into heat. The circumferential edge microwave introducing mechanisms 43a and the central microwave introducing mechanism 43b introduce the microwaves output from the amplifier units 42 to the microwave radiating members 50.

<Probe>

Figure 4:
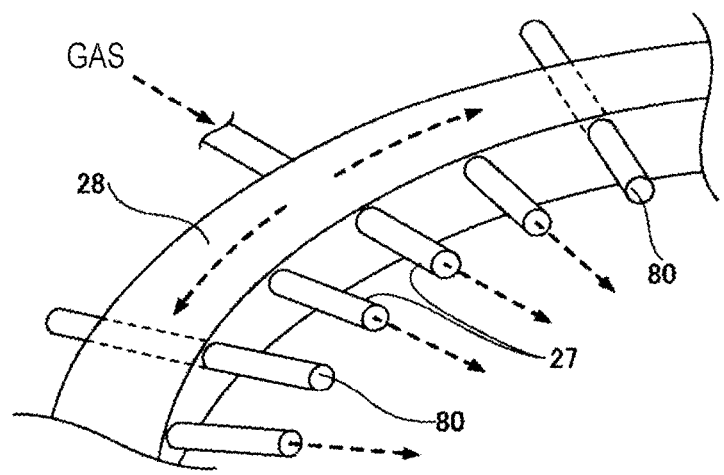
FIG. 4 is a view illustrating an example of an arrangement configuration of probes and gas supply nozzles according to the exemplary embodiment.

As illustrated in FIG. 1, in the microwave plasma processing apparatus 100 according to the present exemplary embodiment, probes 80 are provided at the same height as the gas supply nozzle 27. FIG. 4 is a perspective view illustrating a part of an arrangement configuration of the probes 80 and the gas supply nozzles 27 according to the exemplary embodiment.

The probes 80 are provided on the wall surface of the chamber 1 and protrude inward in a radial direction of the chamber 1 from the wall surface of the chamber 1. The number of probes 80 is six or a multiple of six.

In the present exemplary embodiment, six probes are disposed to correspond to the circumferential edge microwave introducing mechanisms 43a one by one with respect to six circumferential edge microwave introducing mechanisms 43a disposed at regular intervals on the ceiling plate of the chamber 1 and the six microwave transmitting members 122 illustrated in FIG. 2.

However, the number of probes 80 is not limited thereto, and when the number of circumferential edge microwave introducing mechanisms 43a is N, the probes 80 of which the number is N or a multiple of N may be disposed at positions symmetrical with respect to the positions of the N microwave radiating members 50 (N microwave transmitting members 122) which are disposed at regular intervals on the ceiling plate of the chamber 1, based on the central axis O of the chamber 1.

The number of gas supply nozzles 27 is not particularly limited. In the present exemplary embodiment, the number of gas supply nozzles 27 is eighteen, and the gas supply nozzles 27 are disposed at regular intervals in the circumferential direction so that each of the gas supply nozzles 27 is disposed between two probes 80. As described above, the probes 80 and the gas supply nozzles 27 may be disposed at the same height. However, the probes 80 and the gas supply nozzles 27 may be disposed at different heights. In addition, the probes 80 and the gas supply nozzles 27 may be disposed in the circumferential direction of the chamber 1 at the positions symmetrical with respect to the positions of the N microwave radiating members 50 (N microwave transmitting members 122), based on the central axis O of the chamber 1.

Each of the probes 80 monitors electron density Ne of plasma or electron temperature Te of plasma. For example, each probe 80 may have a metallic portion coated with an insulating material such as alumina ($Al_2O_3$). Therefore, it is possible to avoid the occurrence of metal contamination caused by the probes 80 in the chamber 1 during the plasma process, thereby inhibiting the occurrence of particles.

When voltage with sine waves is applied to the probes 80 under the control of the control device 3, a measuring device 81 measures electric current flowing through the probes 80 during the plasma process. The electric current flowing through the probes 80 is equivalent to an electric current flowing through the plasma generated in the chamber 1. The measuring device 81 transmits a signal, which indicates a waveform of the measured electric current, to the control device 3. The microprocessor 4 of the control device 3, which has received the signal, analyzes the waveform of the electric current included in the signal by transforming the waveform of the electric current through Fourier transform, thereby calculating the electron density Ne and the electron temperature Te of the plasma. Therefore, the distribution of the plasma in the circumferential direction below six circumferential edge microwave introducing mechanisms 43*a* may be monitored by six probes 80.

Based on the electron density Ne and the electron temperature Te of the plasma which are calculated based on the measurement result obtained by using the probes 80, the microprocessor 4 controls, in real time during the plasma process, power of the microwaves introduced into the chamber 1 from the circumferential edge microwave introducing mechanisms 43*a* that correspond to the probes 80 used for the calculation. Specifically, based on the calculated electron density Ne and the calculated electron temperature Te of the plasma, the microprocessor 4 adjusts power levels of the microwaves input to the main amplifiers 48 by controlling the variable gain amplifiers 47 of the amplifier units 42 which output the microwaves to the corresponding circumferential edge microwave introducing mechanisms 43*a*. Therefore, the plasma distribution is changed by adjusting the plasma intensity of the microwaves to be introduced into the corresponding circumferential edge microwave introducing mechanisms 43*a*.

Based on the calculated electron density Ne and the calculated electron temperature Te of the plasma, the microprocessor 4 controls, in real time, the phases of the microwaves to be transmitted to the circumferential edge microwave introducing mechanisms 43*a* which correspond to the probes 80 used for the calculation. Specifically, based on the calculated electron density Ne and the calculated electron temperature Te of the plasma, the microprocessor 4 adjusts radiation characteristics by changing the phases of the microwaves by controlling the phase shifters 46 of the amplifier units 42 which output the microwaves to the corresponding circumferential edge microwave introducing mechanisms 43*a*. Therefore, the plasma distribution is changed by controlling directivity by adjusting the phases of the microwaves to be introduced into the corresponding circumferential edge microwave introducing mechanisms 43*a*.

As described above, in the present exemplary embodiment, the power of the microwave and the phase of the microwave are controlled, but at least any one of the power of the microwave and the phase of the microwave may be controlled. However, both of the power of the microwave and the phase of the microwave may be controlled.

Figure 5:
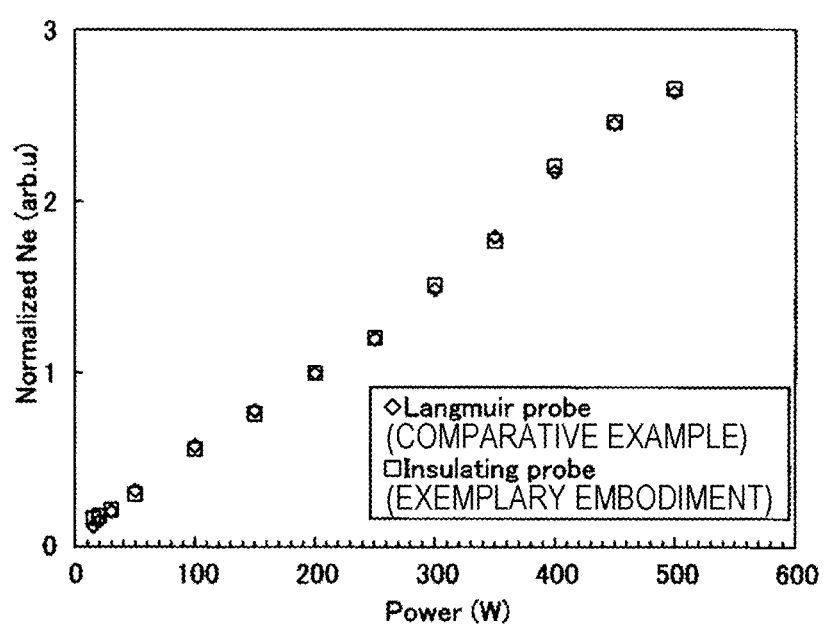
FIG. 5 is a view illustrating an example of power dependency of electron density of plasma measured by probes according to the exemplary embodiment.

A graph of FIG. 5 illustrates an example of a result of comparing power dependency of electron density Ne of plasma measured by the probes 80 according to the present exemplary embodiment with power dependency of electron density Ne measured by a Langmuir probe of a comparative example. According to the present graph, it can be seen that the power dependency of the electron density Ne of the plasma measured by the probes 80 according to the present exemplary embodiment almost coincides with the power dependency of the electron density Ne of the plasma measured by Langmuir probes.

Figure 6:
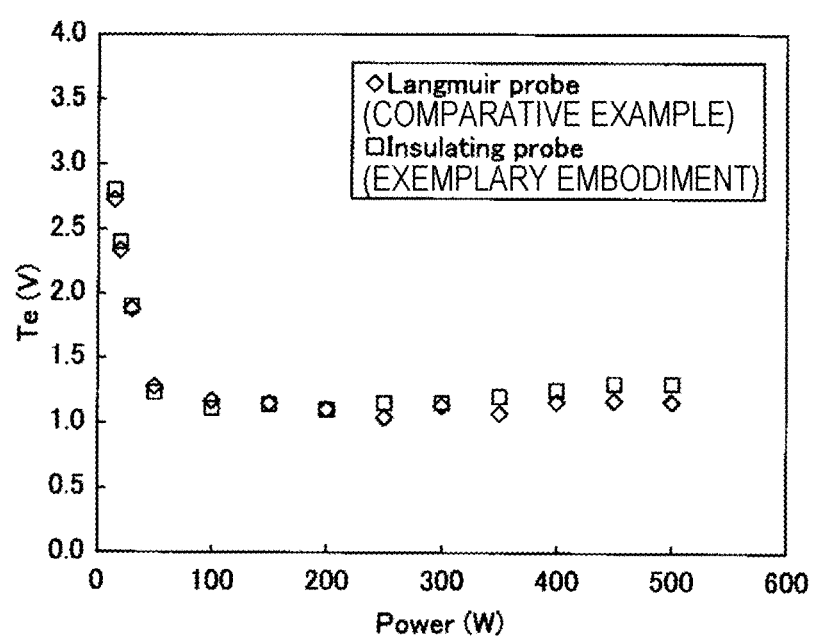
FIG. 6 is a view illustrating an example of power dependency of an electron temperature of the plasma measured by probes according to the exemplary embodiment.

The graph of FIG. 6 illustrates an example of a result of comparing power dependency of electron temperature Te of plasma measured by the probes 80 according to the present exemplary embodiment with power dependency of electron temperature Te measured by Langmuir probes of the comparative example. According to this graph, it can be seen that the power dependency of the electron temperature Te of the plasma measured by the probes 80 according to the present exemplary embodiment almost coincides with the power dependency of the electron temperature Te of the plasma measured by the Langmuir probes.

That is, the result of measuring electrical characteristics of plasma illustrates that the probes 80 according to the present exemplary embodiment and the Langmuir probes have almost the same characteristics, and as a result, it can be confirmed that the probes 8 according to the present exemplary embodiment performs almost the same function as the Langmuir probes. Further, an example of measuring electrical characteristics of plasma using the Langmuir probes is disclosed in Japanese Patent Application Laid-Open No. 2009-194032.

As described above, according to the plasma processing apparatus according to the present exemplary embodiment, the plasma is electrically measured by the N probes 80 which are provided in the chamber 1, and as a result, it is possible to monitor a distribution of the plasma and characteristics of the plasma. Therefore, it is possible to control the distribution of the plasma and uniformity of the plasma, and as a result, it is possible to reduce time and costs required to optimize the process.

<Mounting Position of Probe>

Next, mounting positions of the probes 80 will be described with reference to FIGS. 7A to 7D to FIG. 10. FIGS. 7A to 7D illustrate examples of mounting positions of the probes 80 according to the exemplary embodiment. FIG. 8 illustrates an example of a measurement result by the probes 80 at the mounting positions of the probes 80 in FIGS. 7A to 7D.

Figure 7A:
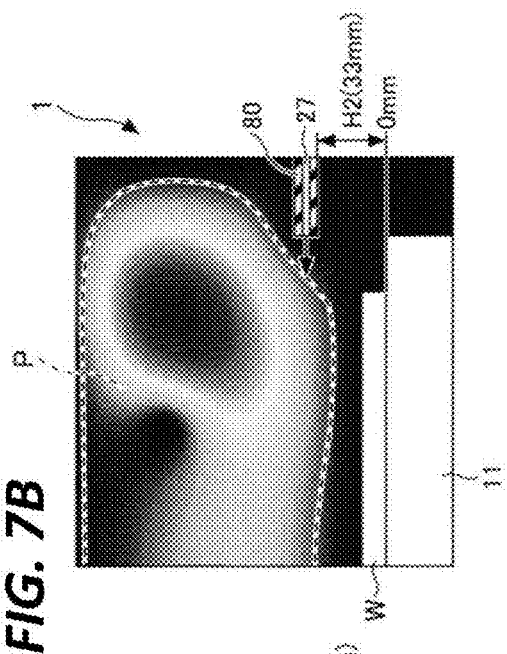
FIGS. 7A to 7D are views illustrating examples of mounting positions of probes according to the exemplary embodiment.
Figure 7B:
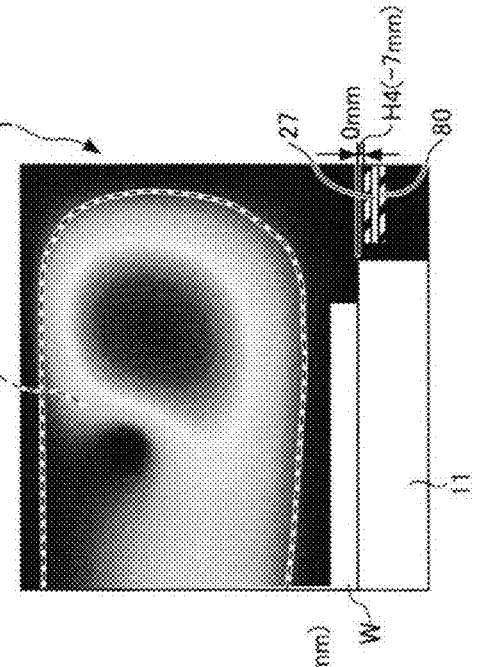
Figure 8:
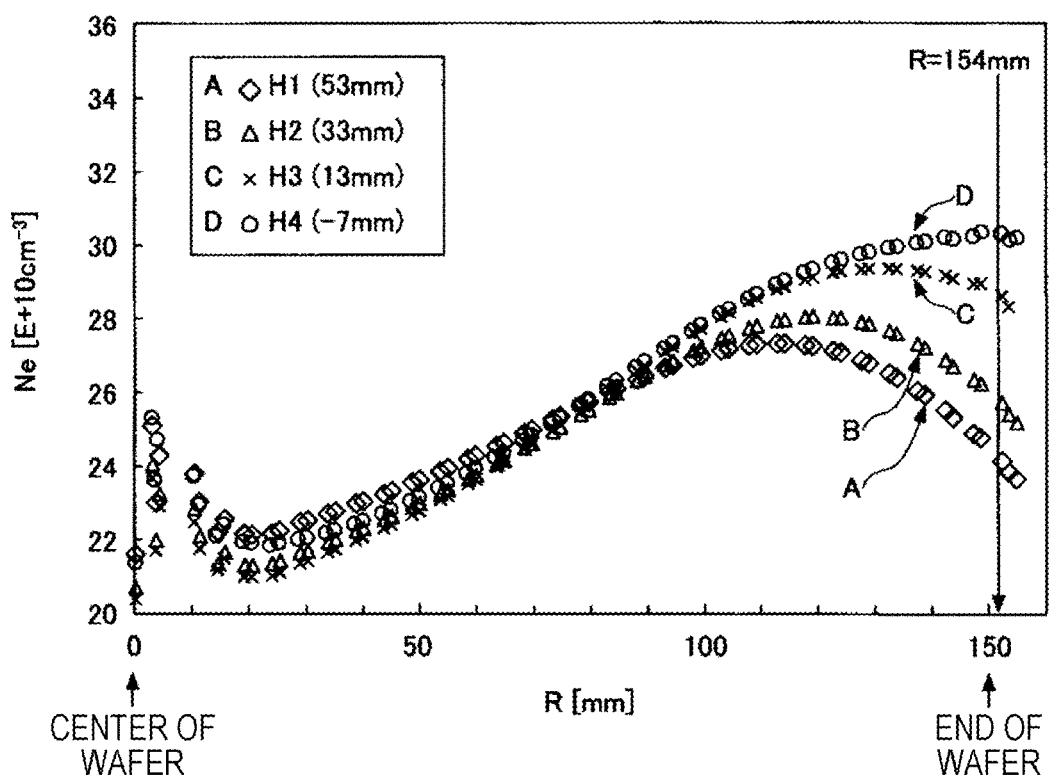
FIG. 8 is a view illustrating an example of a measurement result by the probes at the mounting positions of the probes illustrated in FIGS. 7A to 7D.

FIG. 7A illustrates a case in which a probe 80 is mounted to protrude from the sidewall of the chamber 1 at a position at a height (H1=53 mm) from a surface of the placement table 11 when the surface of the placement table 11 is at a height of 0 mm FIG. 7B illustrates a case in which a probe 80 is mounted to protrude from the sidewall of the chamber 1 at a position at a height (H2=33 mm) from the surface of the placement table 11.

Figure 7C:
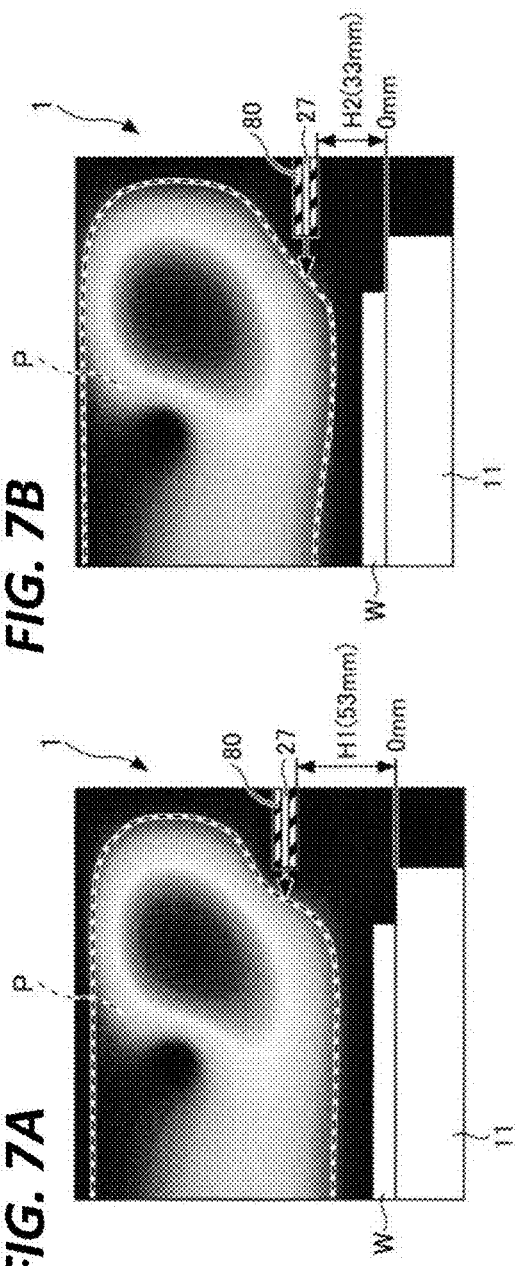
Figure 7D:
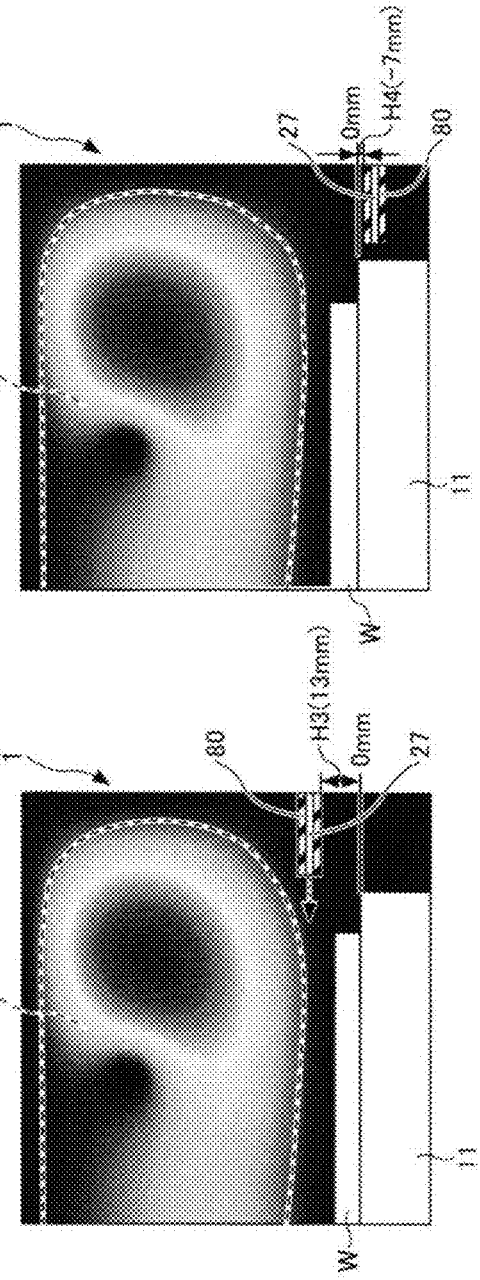

FIG. 7C illustrates a case in which a probe 80 is mounted to protrude from the sidewall of the chamber 1 at a position at a height (H3=13 mm) from the surface of the placement table 11. FIG. 7D illustrates a case in which a probe 80 is mounted to protrude from the sidewall of the chamber 1 at a position at a height (H4=−7 mm) from the surface of the placement table 11 (i.e., at a position slightly lower than the surface of the placement table 11).

All of FIGS. 7A to 7D illustrate that a gas supply nozzle 27 and a probe 80 are provided at the same height.

FIG. 8 illustrates a distribution of electron density Ne of plasma in the radial direction on the surface of the wafer W which is calculated at the mounting positions in FIGS. 7A to 7D based on waveforms of electric currents measured using the probes 80. A horizontal axis indicates a diameter of the wafer W, a left end (R=0 mm) of the horizontal axis indicates a center of the wafer, and a right end (R=150 mm) thereof indicates an end of the wafer W. A vertical axis indicates electron density Ne of plasma.

According to the distribution, it can be seen that since all the probes 80 at the mounting positions in FIGS. 7A to 7D behave similarly, the distribution of plasma is measured. That is, it can be seen that the mounting positions of the probes 80 in a height direction may be any position. However, the electron density Ne of the plasma at the end of the wafer W is increased as the mounting positions of the probes 80 are lowered such that the distribution state of plasma coincides with an actual distribution state of plasma. Therefore, as the mounting positions of the probes 80 are lowered, the measurement result by the probes 80 becomes favorable.

A position for supplying gas needs to be set in consideration of the diffusion of a gas or a position of the wafer W, in order to supply the gas into a space for generating plasma in a case in which the gas supply nozzles 27 and the probes 80 are provided at different heights as well as in the case in which the gas supply nozzles 27 and the probes 80 are provided at the same height. In view of the foregoing, in any case, the height of the probes 80 needs to be within the range from −10 mm to 80 mm when the height of the surface of the placement table 11 is 0 mm.

However, there are the following advantages when the heights of the gas supply nozzles 27 and the probes 80 are equal to each other. That is, when the probes 80 are provided below the gas supply nozzles 27, the amount of electric current flowing through the probes 80 is smaller than the amount of electric current flowing through the plasma such that plasma density Ne obtained as a measurement result is decreased, and as a result, measurement accuracy may deteriorate. However, but when the heights of the gas supply nozzles 27 and the probes 80 are equal to each other, such concern is avoided.

In the present exemplary embodiment, the gas supply nozzles 27, the probes 80, and the microwave radiating members 50 have structural symmetry, and as a result, it is possible to further improve monitoring accuracy of the probes 80.

Figure 9A:
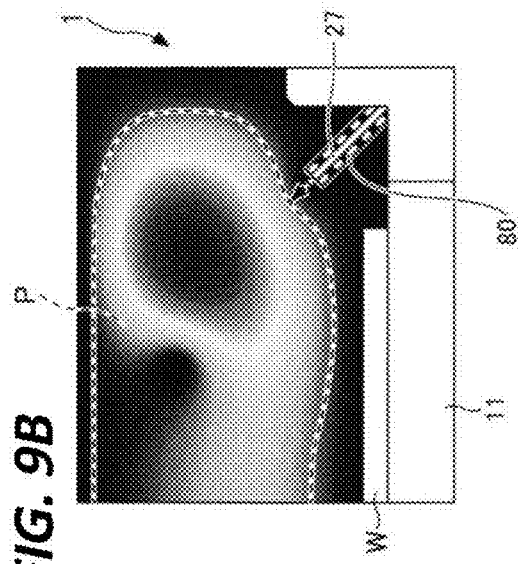
FIGS. 9A to 9D are views illustrating modified examples of the mounting positions of the probe according to the exemplary embodiment.

FIGS. 9A to 9D illustrate other examples of the mounting positions of the probes 80 according to the exemplary embodiment. FIG. 10 illustrates an example of a measurement result by the probes 80 at the mounting positions of the probes 80 in FIGS. 9A to 9D. FIG. 9A has the same condition as FIG. 7A, and the height of the gas supply nozzle 27 and the height of the probe 80 are equal to each other.

Figure 9B:
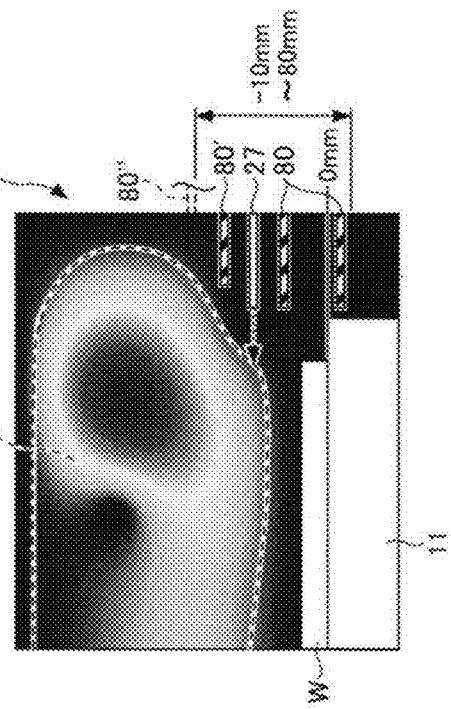
Figure 9C:
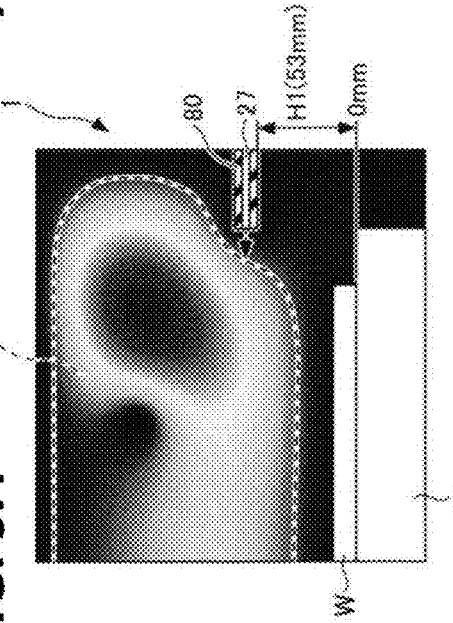
Figure 10:
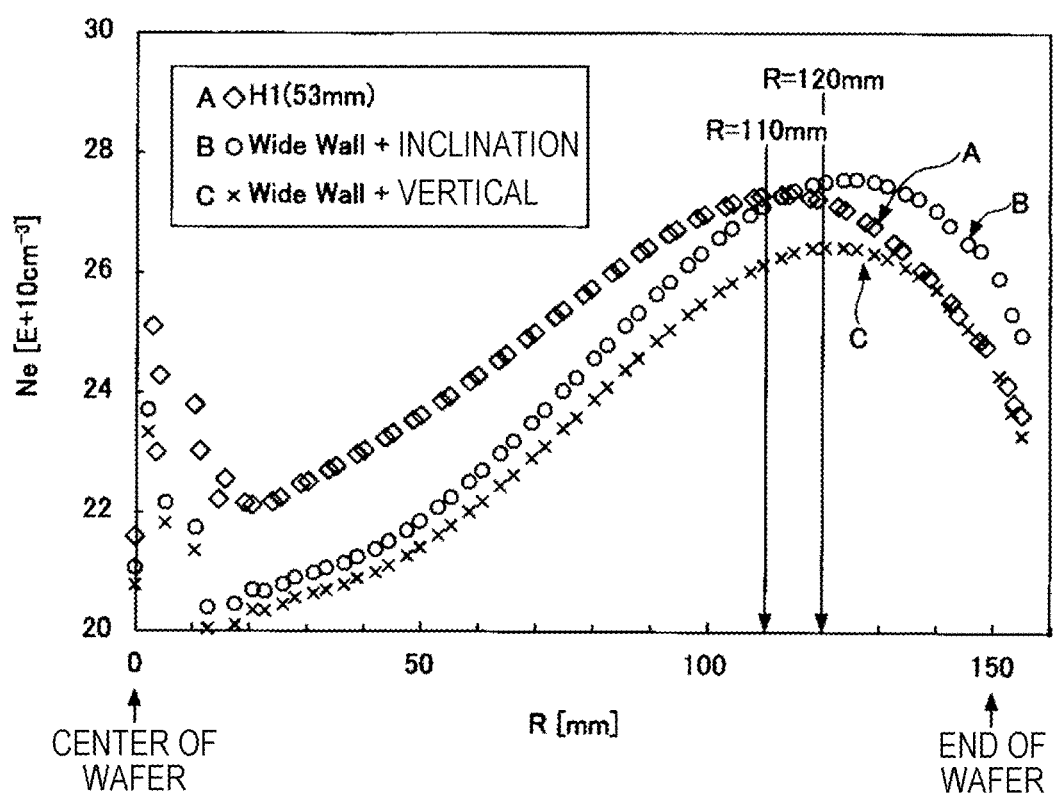
FIG. 10 is a view illustrating an example of a measurement result by the probes at the mounting positions of the probes illustrated in FIGS. 9A to 9D.

FIG. 9B illustrates a case in which a probe 80 is mounted to protrude in an oblique direction from a corner of the bottom surface of the chamber 1. The gas supply nozzle 27 and the probe 80 are mounted at the same height and in the same direction. FIG. 9C illustrates a case in which a probe 80 is mounted to protrude in a vertical direction from the bottom surface of the chamber 1. The gas supply nozzle 27 and the probe 80 are mounted in the same direction from the same position.

FIG. 10 illustrates a distribution of electron density Ne of plasma in the radial direction on the surface of the wafer W which is calculated at the mounting positions in FIGS. 9A to 9C based on waveforms of electric current measured by using the probes 80. The horizontal axis and the vertical axis are identical to those in FIG. 8.

According to the distribution, all of the probes 80 behave similarly, and the electron density Ne of the plasma tends to be decreased toward the end of the wafer W, but the distribution of the plasma is measured. From the results described above, it can be seen that any of the mounting positions and any of the mounting angles of the probes 80 illustrated in FIGS. 9A to 9C are good.

In view of the foregoing, in the case in which the probes 80 are provided at a height equal to the height of the gas supply nozzles 27 or provided at a height lower than the height of the gas supply nozzles 27, the probes 80 may protrude from the side surface or the bottom surface of the chamber 1 in the horizontal direction, the oblique direction, or the vertical direction toward the inside of the chamber 1 in the radial direction. In this case, the tips of six probes 80 are provided at the same height ranging from −10 mm to 80 mm in the vertical direction from the surface (0 mm) of the placement table 11.

Figure 9D:
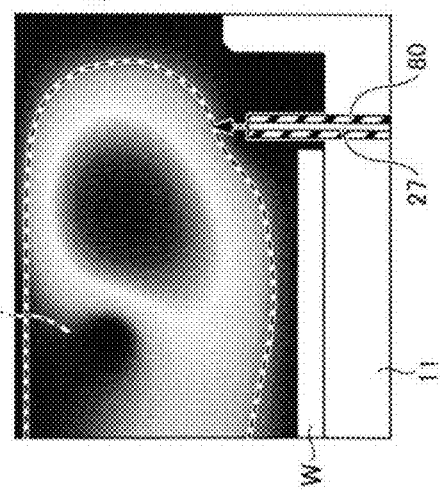

FIG. 9D illustrates a variation in a case in which probes 80 is horizontally provided at heights different from the height of the gas supply nozzle 27. In this case, the probes 80 may be mounted at a position lower than the gas supply nozzle 27. However, six probes 80 are provided at the same height ranging from −10 mm to 80 mm in the vertical direction from the surface (0 mm) of the placement table 11.

A probe 80' is a probe 80 which is mounted at a position higher than the plurality of gas supply nozzles 27, and a dash is conveniently added to the reference numeral of the probe 80 in order to distinguish the probe 80' from the probes 80 mounted at the other positions. The probe 80' may be disposed at a portion where plasma P is less present. For this reason, the probe 80', which is mounted at the position higher than the plurality of gas supply nozzles 27, has a shorter radial length than the plurality of gas supply nozzles 27. To prevent an interference with the plasma P, the probe 80' may have a shorter radial length as the height at which the probe 80' is disposed is increased.

For example, a sensor 80" is embedded in a wall surface of the chamber 1 such that the tip end of the sensor 80" is exposed from a surface identical to the wall surface of the chamber 1, but the sensor 80" does not protrude from the wall surface of the chamber 1. As described above, in the present exemplary embodiment, the sensor, which monitors the electron density Ne and the electron temperature Te of the plasma generated in the chamber 1, is not limited to the probe 80 and the probe 80', but may be the sensor 80".

<Real Time Control>

Figure 11:
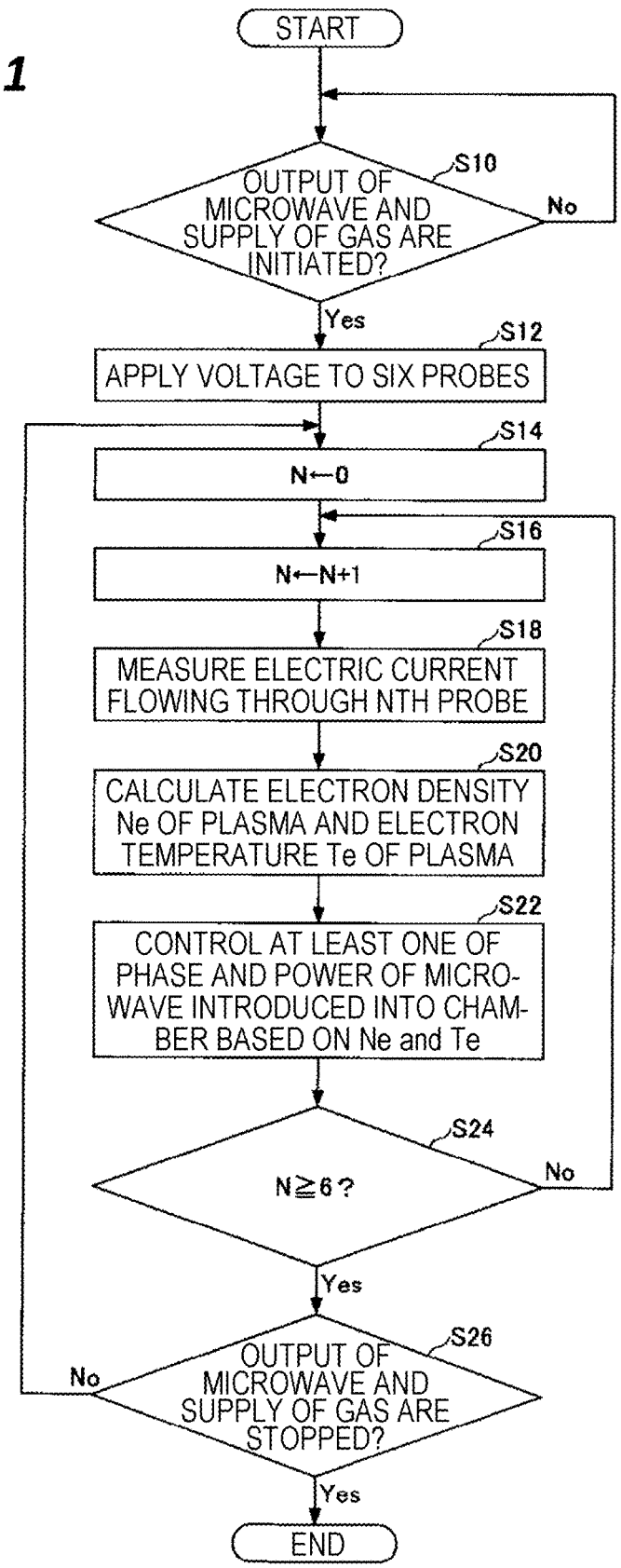
FIG. 11 is a flowchart illustrating an example of a process of controlling microwaves in accordance with the measurement result by the probes according to the exemplary embodiment.

Lastly, an example of a real time process of controlling microwaves in accordance with a measurement result by the probes 80 of the microwave plasma processing apparatus 100 according to the present exemplary embodiment will be described with reference to a flowchart of FIG. 11. The present process is mainly performed by the microprocessor 4 of the control device 3.

When the present process is initiated, the microprocessor 4 determines whether an output of microwaves and a supply of gas are initiated (step S10).

When the microprocessor 4 determines that the output of the microwaves and the supply of the gas are initiated, the microprocessor 4 applies voltage to the six probes 80 (step S12). Next, the microprocessor 4 sets a variable N to "0" (step S14).

Next, the microprocessor 4 adds "1" to the variable N (step S16). The measuring device 81 measures electric current flowing through the $N^{th}$ probe 80, and transmits a signal indicating the measurement result to the control device 3 (step S18).

The microprocessor 4 receives the signal from the measuring device 81, and acquires a waveform of the electric current indicated by the signal. The microprocessor 4 calculates the electron density Ne of the plasma and the electron temperature Te of the plasma by analyzing the acquired waveform of the electric current by transforming the acquired waveform of the electric current through Fourier transform (step S20). Therefore, it is possible to monitor a distribution of plasma in the circumferential direction at a position below one circumferential edge microwave introducing mechanism 43a which is specified by a used probe 80 among the six circumferential edge microwave introducing mechanisms 43a.

Next, based on the calculated electron density Ne and the calculated electron temperature Te of the plasma, the microprocessor 4 may control, in real time, the power of the microwave introduced into the chamber 1 from the circumferential edge microwave introducing mechanism 43a corresponding to the probe 80 used for the measurement. In addition, the microprocessor 4 may control, in real time, the phase of the microwave transmitted from the corresponding circumferential edge microwave introducing mechanism 43a.

Next, the microprocessor 4 determines whether the variable N is six or more (step S24). When the variable N is less than six, the microprocessor 4 determines that the measurement by all the probes 80 is not completed, and the process goes back to step S16, and steps S16 to S24 are repeated. Meanwhile, when the variable N is six or more, the microprocessor 4 determines that the measurement by all the probes 80 is completed, and determines whether the output of the microwave and the supply of the gas are stopped (step S26). When the microprocessor 4 determines that the output of the microwave and the supply of the gas are not stopped, the process goes back to step S14, the variable N is initialized (step S14), and the subsequent processes are repeated. Meanwhile, when the microprocessor 4 determines that the output of the microwave and the supply of the gas are stopped, the present process ends.

As described above, according to the microwave plasma processing apparatus 100 of the present exemplary embodiment, the electron density Ne of the plasma and the electron temperature Te of the plasma are monitored by the probes 80, thereby ascertaining the distribution of the plasma and the characteristics of the plasma.

Therefore, based on the electron density Ne of the plasma and the electron temperature Te of the plasma, at least any one of the power of the introduced microwave and the phase of the introduced microwave may be controlled in real time. As a result, it is possible to improve uniformity of plasma.

Based on the electron density Ne of the plasma or the electron temperature Te of the plasma, at least any one of the power of the introduced microwave and the phase of the introduced microwave may be controlled in real time. Even in this case, it is possible to improve uniformity of plasma.

For example, the microwave plasma processing apparatus according to the present disclosure may monitor a film thickness. Specifically, a film is formed on the probe during the plasma process, and as a result, a waveform of an electric current flowing through the respective probes, which is measured by the measuring device, is changed. Therefore, the control device of the microwave plasma processing apparatus according to the present disclosure may estimate a thickness of a film attached to the probe by analyzing a change in intensity of the signals acquired from the respective probes. Therefore, it is possible to ascertain a state in the chamber 1.

According to the microwave plasma processing apparatus according to the present disclosure, it is possible to ascertain an energy distribution of kinetic energy of electrons by using an electric energy distribution function (EEDF).

Herein, the semiconductor wafer W has been described as an example of a workpiece. However, the workpiece is not limited thereto, and various types of substrates may be used for a liquid crystal display (LCD) or a flat panel display (FPD), a photo mask, a CD substrate, a printed substrate, and the like.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a processing container having a ceiling plate and a cylindrical wall, the cylindrical wall comprising an inner wall surface and an outer wall surface;
a plurality of gas supply nozzles which are provided on the inner surface of the processing container and supply process gas toward an inside of the processing container in a radial direction, wherein each of the plurality of gas supply nozzles protrudes toward the inside of the processing container;
N microwave introducing radiators disposed in a circumferential direction of the ceiling plate of the processing container so as to introduce microwaves for generating plasma into the processing container, wherein N>2;
N microwave transmitting windows provided in correspondence with and below the N microwave introducing radiators, respectively, wherein each of the N microwave transmitting window is made of a dielectric material; and
M sensors embedded in the cylindrical wall of the processing container so as to monitor at least any one of electron density Ne and electron temperature Te of the plasma generated in the processing container, wherein M is greater than N, and M equals to a multiple of N, the M sensors protruding towards the inside of the processing container,
wherein the M sensors and the plurality of gas supply nozzles are provided at a same height and protrude in a horizontal direction, the M sensors and the plurality of gas supply nozzles being circumferentially spaced apart from each other, and wherein the M sensors are disposed at positions symmetrical with respect to a central axis of the chamber.

2. The plasma processing apparatus according to claim 1, wherein the M sensors protrude in the radial direction.

3. The plasma processing apparatus according to claim 1, wherein the M sensors are probes that protrude from the wall surface of the processing container toward the inside of the processing container in the radial direction.

4. The plasma processing apparatus according to claim 3, wherein the M probes are coated with an insulating material.

5. The plasma processing apparatus according to claim 1, wherein the M sensors are provided at the same height ranging from −10 mm to 80 mm in a vertical direction from a surface of a placement table on which a workpiece is placed in the processing container.

6. The plasma processing apparatus according to claim 1, wherein the M sensors are disposed at positions symmetrical with respect to positions of the N microwave introducing radiators disposed at regular intervals on the ceiling plate of the processing container based on a central axis of the processing container.

7. The plasma processing apparatus according to claim 1, wherein each of the N microwave transmitting windows serve for forming surface wave plasma uniform in the circumferential direction.

8. The plasma processing apparatus of claim 7, further comprising:

another microwave introducing radiator disposed at a center of the ceiling plate of the processing container so as to introduce microwaves; and another microwave transmitting window provided in correspondence with and below the another microwave introducing radiator.

9. The plasma processing apparatus of claim 7, further comprising N slots provided in correspondence with the N microwave introducing radiators, respectively, wherein each of the N slots is provided below the respective N microwave introducing radiators and above the respective N microwave transmitting windows.

* * * * *